United States Patent
Oh et al.

(10) Patent No.: US 11,004,949 B2
(45) Date of Patent: May 11, 2021

(54) TRANSISTOR INCLUDING ELECTRIDE ELECTRODE

(71) Applicant: Samsung Electronics Co., Ltd., Suwon-si (KR)

(72) Inventors: Youngtek Oh, Suwon-si (KR); Jinwook Jung, Seongnam-si (KR); Seunggeol Nam, Suwon-si (KR); Wontaek Seo, Yongin-si (KR); Insu Jeon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/238,706

(22) Filed: Jan. 3, 2019

(65) Prior Publication Data
US 2020/0044041 A1   Feb. 6, 2020

(30) Foreign Application Priority Data

Aug. 6, 2018   (KR) .................. 10-2018-0091439

(51) Int. Cl.
*H01L 31/119*   (2006.01)
*H01L 29/45*   (2006.01)

(52) U.S. Cl.
CPC .................... *H01L 29/45* (2013.01)

(58) Field of Classification Search
CPC ....................................... H01L 29/45
See application file for complete search history.

(56) References Cited

U.S. PATENT DOCUMENTS

| | | |
|---|---|---|
| 1,745,175 A | 1/1930 | Lilienfeld |
| 1,877,140 A | 9/1932 | Lilienfeld |
| 1,900,018 A | 3/1933 | Lilienfeld |
| 3,206,670 A | 9/1965 | Atalla |
| 5,045,484 A * | 9/1991 | Yamada ............... H01L 21/316 438/234 |
| 7,528,058 B2 | 5/2009 | Mantl et al. |
| 2014/0008649 A1* | 1/2014 | Umeda ............... H01L 29/7869 257/43 |

(Continued)

FOREIGN PATENT DOCUMENTS

WO   WO-2014192701 A1 * 12/2014

OTHER PUBLICATIONS

Youngtek Oh et al. "Electric field effect on the electronic structure of 2DY$_2$C electride" 2D Mater.5 (2018).

(Continued)

*Primary Examiner* — Samuel A Gebremariam
(74) *Attorney, Agent, or Firm* — Harness, Dickey & Pierce, P.L.C.

(57) ABSTRACT

Provided are transistors including an electride electrode. The transistor includes a substrate, a source region and a drain region doped with ions of different polarity from the substrate in a surface of the substrate, a source electrode and a drain electrode including an electride material on the source region and the drain region, a gate insulating layer surrounding the source electrode and a drain electrode on the substrate, and a gate electrode between the source electrode and the drain electrode on the substrate. The source electrode and the drain electrode have an ohmic contact with the substrate.

18 Claims, 4 Drawing Sheets

(56) References Cited

U.S. PATENT DOCUMENTS

| | | | | |
|---|---|---|---|---|
| 2014/0117286 A1* | 5/2014 | Jun | ............... | C09K 11/025 |
| | | | | 252/301.6 S |
| 2014/0158989 A1* | 6/2014 | Byun | ............... | H01L 29/458 |
| | | | | 257/29 |
| 2017/0342449 A1* | 11/2017 | Kishino | ............... | C12P 21/00 |
| 2018/0304237 A1* | 10/2018 | Hosono | ............... | B01J 37/086 |

OTHER PUBLICATIONS

T. Nishimura et al. "Evidence for strong Fermi-level pinning due to metal-induced gap states at metal/germanium interface" Appl. Phys. Lett. 91, 123123 (2007).

S.M. Sze et al. "Physics of Semiconductor Devices" A John Wiley & Sons, Inc., Publication (2007).

Toriumi/Nagashio Laboratory <<http://www.adam.t.u-tokyo.ac.jp/research_e.html>> last accessed Dec. 26, 2018.

Y. Wan et al., "A magnesium/amorphous silicon passivating contact for n-type crystalline silicon solar cells" Appl. Phys Lett.

Y. Toda et al., "Surface of Room-Temperature-Stable Electride $[Ca_{24}Al_{28}O_{64}]^{4+}(e^-)4$: Preparation and Its Characterization by Atomic-Resolution Scanning Tunneling Microscopy" American Chemical Society, vol. 5, No. 3, 1907-1914 (2011).

E. Feizi et al. "$12CaO.7Al_2O_3$ Ceramic: A Review of the Electronic and Optoelectronic Applications in Display Devices" Journal of Display Technology, vol. 12, No. 5, May 2016.

W. Liu et al., "Role of Metal Contacts in Designing High-Performance Monolayer n-type $WSe_2$ Field Effect Transistors" ACS publications, Nano Lett. 2013, 13, 1983-1990.

T. Inoshita et al. "Probing a divergent van Hove singularity of graphene with a $Ca_2N$ support: a layered electride as a solid-state dopant" cond-mat.mtrl-sci, Aug. 3, 2017.

K. Lee et al., "Dicalcium nitride as a two-dimensional electride with an anionic electron layer" Nature, vol. 494, Feb. 21, 2103.

Y. Ma et al., "Transparent Dense Sodium" National Science Foundation, 1-12.

"New Electride Made of Multiple Metals Discovered" <<https://www.titech.ac.jp/english/news/2017/039166.html>> last accessed Dec. 26, 2018.

S. Matsuishi et al., "High-Density Electron Anions in a Nanoporous Single Crystal: $[Ca_{24}Al_{28}O_{64}]^{4+}(e^-)$" Science, vol. 301, Aug. 1, 2003.

D. Udeshi et al., "Electrical characterization of interface stability between magnesium and selenium-passivated n-type silicon (001)" INternational Journal of Electronics, 92:12, 719-727 (2005).

Robert Chau et al., "Integrated nanoelectronics for the future," Nature Materials, vol. 6, Nov. 2007.

Paul M. Koenraad et al., "Single dopants in semiconductors," Nature Materials, vol. 10, Feb. 2011.

* cited by examiner

TRANSISTOR INCLUDING ELECTRIDE ELECTRODE

CROSS-REFERENCE TO RELATED APPLICATION

This application claims the benefit of Korean Patent Application No. 10-2018-0091439, filed on Aug. 6, 2018, in the Korean Intellectual Property Office, the disclosure of which is incorporated herein in its entirety by reference.

BACKGROUND

1. Field

The present disclosure relates to transistors including an electride electrode, and more particularly, to transistors including a source electrode and a drain electrode formed of an electride on a semiconductor substrate.

2. Description of the Related Art

According to the reduction of the size of a metal-oxide-semiconductor field effect transistor (MOSFET) to a nano scale, the integrity of the device is increased, but the formation of an ohmic contact of a source electrode and a drain electrode is difficult. There is a method of forming an ohmic contact by doping, at a high concentration of, for example, $10^{20}$ cm$^{-3}$, a semiconductor region that contacts a source electrode and a drain electrode. However, when this method is applied to a nano-size region, there is a limit in increasing a doping concentration of the nano-size region due to a dopant solubility problem, and also, the dopant may not be uniformly doped due to a dopant fluctuation phenomenon, and thus, the doping concentration of an electrode may be reduced. Accordingly, an ohmic contact of the source and drain electrodes may not be well formed and again a Schottky contact may occur, and thus, the resistance of the source electrode and the drain electrode may be increased.

Also, when the source and drain electrodes contact a surface of a semiconductor, a Fermi-level pinning phenomenon may occur due to an interface state, such as a dangling bond at an interface of the semiconductor, and, as a result, a Schottky contact may occur.

SUMMARY

Provided are transistors including an electride electrode that forms an ohmic contact without forming highly doped regions.

Additional aspects will be set forth in part in the description which follows and, in part, will be apparent from the description, or may be learned by practice of the presented example embodiments.

According to an aspect of at least one example embodiment, a transistor includes a substrate, source and drain regions doped with ions of polarity different from that of the substrate on a surface of the substrate, source and drain electrodes including an electride material on the source region and drain region, respectively, a gate insulating layer surrounding the source and drain electrodes on the substrate, and a gate electrode arranged between the source electrode and the drain electrode on the substrate.

The transistor may further include a metal layer covering the source electrode and the drain electrode on the gate insulating layer.

The source electrode and the drain electrode respectively may contact the source region and the drain region, may not be coated with a conductive layer, and may include an $Y_5Si_3$ electride.

The transistor may further include a passivation layer that contacts the substrate on lower sides of the source and drain electrodes.

The source and drain electrodes may include a $C_{12}A_7$ electride, a two-dimensional (2D) electride, or a $Y_5Si_3$ electride.

The 2D electride may include $Ca_2N$, $Y_2C$, and $Gd_2C$ or a combination or subcombination thereof.

The 2D electride may be a single crystal including interlayer electron layers, and the interlayer electron layers of the 2D electride may be vertically formed with respect to the surface of the substrate.

The passivation layer may include a Group VI material layer configured to combine with a dangling bond on a surface of the substrate.

The Group VI material layer may include Se or S.

The passivation layer may have a thickness less than that of the gate insulating layer.

The transistor may further include a single graphene layer between the Group VI material layer and the source and drain electrodes.

The Group VI material layer may include one layer to about five layers thereof.

The passivation layer may be at least one insulating layer.

The transistor may further include a single graphene layer between the insulating layer and the source and drain electrodes.

The transistor may further include an insulating layer covering the source region and the drain region on the substrate, wherein the source and drain electrodes and the gate insulating layer are on the insulating layer.

The insulating layer may have a thickness less than that of the gate insulating layer.

The insulating layer may include silicon oxide or silicon nitride.

The insulating layer may include one layer to about five layers thereof.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
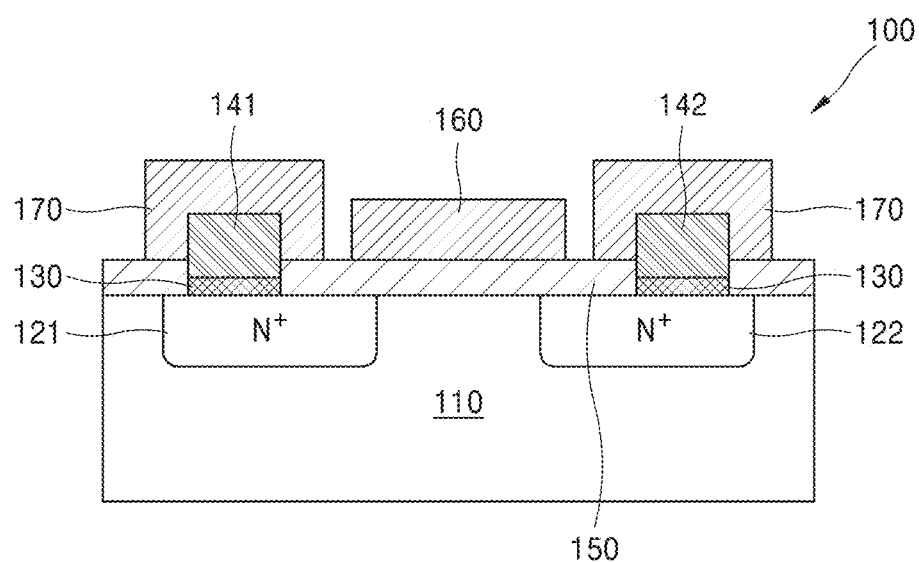
FIG. 1 is a schematic cross-sectional view of a transistor including an electride electrode according to at least one example embodiment.

Hereinafter, reference will now be made in detail to embodiments, examples of which are illustrated in the accompanying drawings. In the drawings, thicknesses of regions or layers are exaggerated for clarity of specification. In this regard, the present example embodiments may have different forms and should not be construed as being limited to the descriptions set forth herein.

It will also be understood that when an element is referred to as being "on" or "above" another element, the element may be in direct contact with the other element or other intervening elements may be present.

Figure 2:
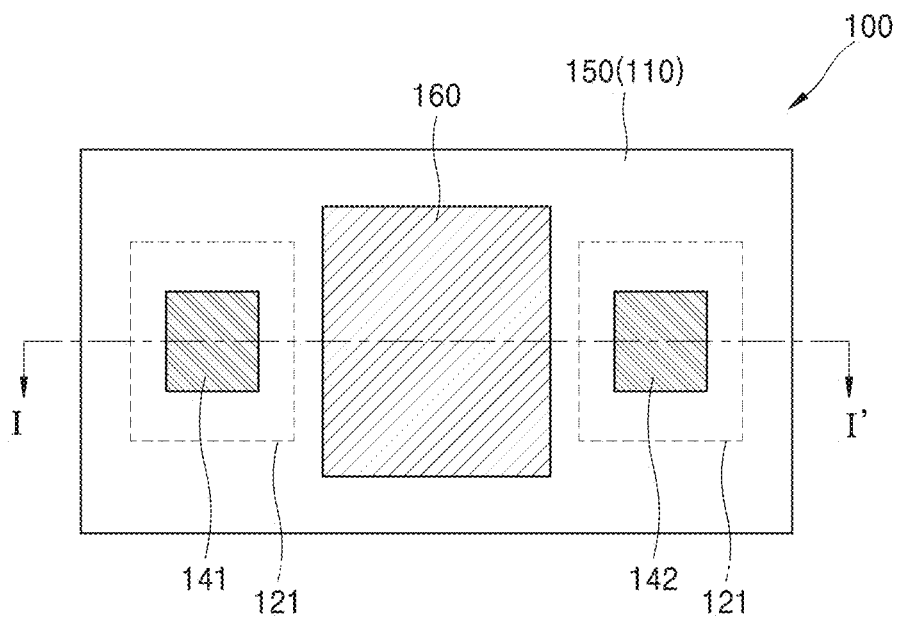
FIG. 2 is a plan view of a transistor including an electride electrode according to at least one example embodiment.

FIG. 1 is a schematic cross-sectional view of a transistor 100 including an electride electrode according to at least one example embodiment. FIG. 2 is a plan view of the transistor 100 including an electride electrode according to at least one example embodiment. FIG. 1 is a cross-sectional view taken along line I-I' of FIG. 2. In FIG. 2, some constituent elements are omitted for convenience of explanation.

Referring to FIGS. 1 and 2, the transistor 100 may include two doping regions 121 and 122 that are apart from each other in a surface of a semiconductor substrate 110. The semiconductor substrate 110 may include silicon or germanium. The two doping regions 121 and 122 may be doped to have a polarity different from that of the semiconductor substrate 110. For example, the semiconductor substrate 110 may be a region doped with a p-type dopant, and the two doping regions 121 and 122 may be regions doped with an n-type dopant. However, the present example embodiments are not limited thereto. For example, the semiconductor substrate 110 may be a region doped with an n-type dopant, and the two doping regions 121 and 122 may be regions doped with a p-type dopant. The transistor 100 may be a metal-oxide-semiconductor field effect transistor (MOSFET). The doping concentration of the two doping regions 121 and 122 may be in a range of about $10^{12}$ cm$^{-3}$ to about $10^{18}$ cm$^{-3}$.

One of the two doping regions 121 and 122 may be a source region 121 and the other one may be a drain region 122. A source electrode 141 and a drain electrode 142 including an electride material may be formed on the source region 121 and the drain region 122, respectively. A passivation layer 130 may be formed on lower sides of the source electrode 141 and the drain electrode 142 on the source region 121 and the drain region 122, respectively. The passivation layer 130 may reduce or prevent a Fermi-level pinning phenomenon by combining with a dangling bond formed on a surface of the semiconductor substrate 110. The passivation layer 130 may be a Group VI material layer. The Group VI material layer may include selenium (Se) or sulphur(S). The passivation layer 130 may combine with two dangling bonds formed on the surface of the semiconductor substrate 110. The passivation layer 130 may include one layer to about five layers thereof. That is, the passivation layer 130 may have a thickness in a range of 1-5 times of the thickness of the single passivation layer 130. The passivation layer 130 may have a thickness of approximately less than 10 Å.

A gate insulating layer 150 surrounding side surfaces of the passivation layer 130 and the source and drain electrodes 141 and 142 may be formed on the semiconductor substrate 110. A gate electrode 160 may be arranged between the source electrode 141 and the drain electrode 142 on the gate insulating layer 150. The gate insulating layer 150 may have a thickness that is greater than that of the passivation layer 130. For example, the gate insulating layer 150 may have a thickness in a range of about 1 nm to about 50 nm.

A metal layer 170 covering the source electrode 141 and the drain electrode 142 may be formed on the gate insulating layer 150. The metal layer 170 may include a general material used as an electrode in a semiconductor process. For example, the metal layer 170 may include Al, Cu, Au, etc. The metal layer 170 may include the same metal as that of the gate electrode 160. The metal layer 170 reduces or prevents the source electrode 141 and the drain electrode 142 from contacting air and moisture.

The source electrode 141 and the drain electrode 142 may include an electride. The source electrode 141 and the drain electrode 142 may include a $C_{12}A_7$ electride, a 2D electride, or a $Y_5Si_3$ electride. The $C_{12}A_7$ electride may be expressed as $C_{12}A_7$:e$^-$. The $C_{12}A_7$ electride is formed by filling an oxygen site of the $C_{12}A_7$ with an electron, and the electron may act as an anion.

The 2D electride may include $Ca_2N$, $Y_2C$, $Gd_2C$, etc. The source electrode 141 and the drain electrode 142 may be formed by sputtering a single crystal electride. The source electrode 141 and the drain electrode 142 formed by the sputtering process may be poly crystals.

Figure 3:
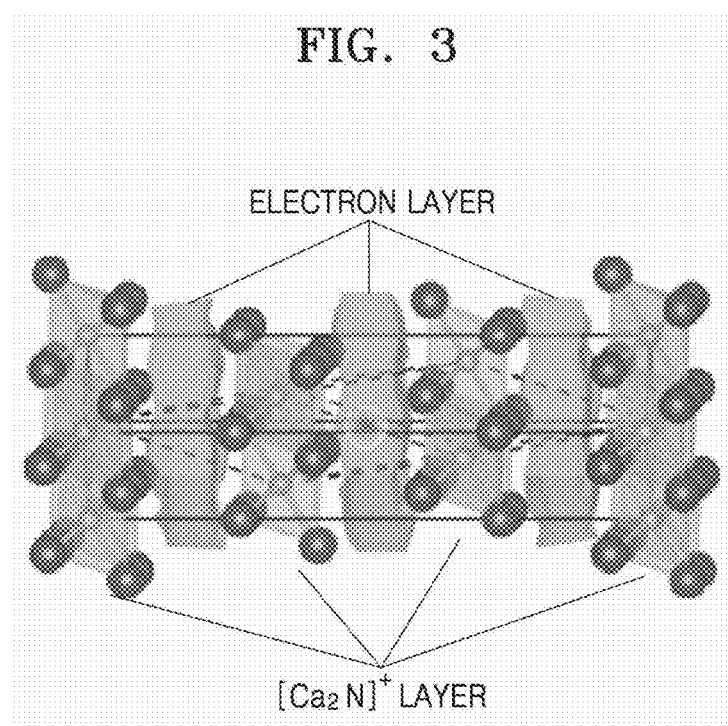
FIG. 3 is a diagram showing a layer structure of a two-dimensional (2D) electride.

The 2D electride may have a layer structure. FIG. 3 is a diagram showing a layer structure of a $Ca_2N$ electride. Referring to FIG. 3, electron layers are formed between $[Ca_2N]^+$ layers. The electron layers may be referred to as 2D electron gas. A current may readily flow in the 2D electride through the electron layers. In the 2D electride, the electron layers may be perpendicularly formed with respect to the surface of the semiconductor substrate 110.

An electride material may have a work function that is less than that of silicon. The electride material having a low work function may form an ohmic contact with the semiconductor substrate 110. However, due to an interface state formed on the surface of the semiconductor substrate 110, a Fermi-level pinning phenomenon may occur, and thus, a Schottky contact may be formed. The passivation layer 130 may reduce or prevent the Fermi-level pinning phenomenon on the semiconductor substrate 110 by combining with dangling bonds of the surface of the semiconductor substrate 110. Thus, the source electrode 141 and the drain electrode 142 of the transistor 100 may form an ohmic contact.

In the transistor 100 according to at least one example embodiment, it is unnecessary to form highly doped well regions in the source region 121 and the drain region 122 to form an ohmic contact of the source electrode 141 and the drain electrode 142, and thus, a smaller and/or miniature transistor having an ohmic contact may be realized.

Figure 4:
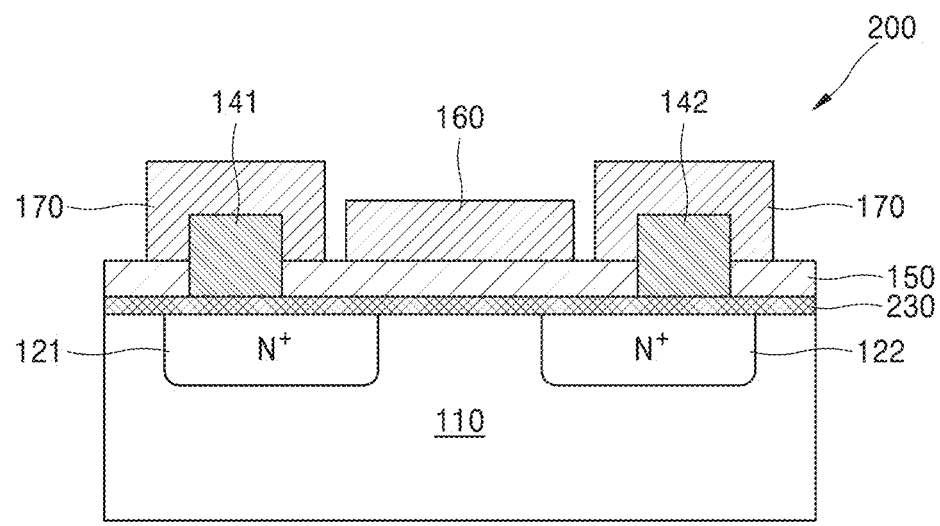
FIG. 4 is a cross-sectional view of a transistor including an electride electrode according to at least one example embodiment.

FIG. 4 is a cross-sectional view of a transistor 200 including an electride electrode according to at least one example embodiment. Like reference numerals are used to indicate substantially identical elements of FIG. 1, and the detailed descriptions thereof will be omitted.

Referring to FIG. 4, the transistor 200 may include two doping regions 121 and 122 that are apart from each other on a surface of a semiconductor substrate 110. The semiconductor substrate 110 may include silicon or germanium. The two doping regions 121 and 122 may be regions doped with a different polarity from that of the semiconductor substrate 110. For example, the semiconductor substrate 110 may be a region doped with a p-type dopant, and the two doping regions 121 and 122 may be regions doped with an n-type dopant. However, example embodiments are not limited thereto. For example, the semiconductor substrate 110 may be a region doped with an n-type dopant, and the two doping regions 121 and 122 may be regions doped with a p-type dopant. The transistor 200 may be a MOSFET. The doping concentration of the two doping regions 121 and 122 may be in a range of about $10^{12}$ cm$^{-3}$ to about $10^{18}$ cm$^{-3}$. One of the two doping regions 121 and 122 may be a source region 121 and the other one may be a drain region 122.

An insulating layer 230 may be formed on the semiconductor substrate 110. The insulating layer 230 may be referred to as a passivation layer. The insulating layer 230 may be formed between the semiconductor substrate 110 and source and drain electrodes 141 and 142, and may have a thickness, for example, through which tunneling of carriers, for example, electrons, is possible. The insulating layer 230 may include silicon oxide, silicon nitride, etc. The insulating layer 230 may reduce or prevent a Fermi-level pinning phenomenon that occurs due to an interface state formed on a surface of the semiconductor substrate 110. When the insulating layer 230 has a large thickness, a resistance of the insulating layer 230 increases, and thus, the insulating layer 230 needs to have a small thickness. The insulating layer 230 may include one layer to about five layers thereof. The insulating layer 230 may have a thickness in a range of about 2 Å to about 10 Å. When the insulating layer 230 includes more than 5 layers, the tunneling of charges may be more difficult. When the insulating layer 230 does not cover a portion of regions of the source electrode 141 and the drain electrode 142, the Fermi-level pinning phenomenon may occur, and thus, the formation of an ohmic contact of the source and drain electrodes 141 and 142 may be more difficult.

The source electrode 141 and the drain electrode 142 including an electride material may be formed on the insulating layer 230 in the source region 121 and the drain region 122, respectively.

A gate insulating layer 150 surrounding the source electrode 141 and the drain electrode 142 may be formed on the insulating layer 230. The gate insulating layer 150 may include the same material as or a different material from the insulating layer 230. The gate insulating layer 150 may have a thickness that is greater than that of the insulating layer 230. The gate insulating layer 150 may have a thickness in a range of about 1 nm to about 50 nm.

Metal layers 170 surrounding the source electrode 141 and the drain electrode 142 and a gate electrode 160 may be formed on the gate insulating layer 150. The metal layers 170 may reduce or prevent the source electrode 141 and the drain electrode 142 from contacting air and moisture.

The source electrode 141 and the drain electrode 142 may include an electride material. The electride material may have a work function that is less than that of silicon. The low work function of the electride material enables the formation of an ohmic contact between the electride material and the semiconductor substrate 110. The insulating layer 230 reduces or prevents a Fermi-level pinning phenomenon by reducing or preventing the formation of an interface state on the surface of the semiconductor substrate 110, and thus, the source electrode 141 and the drain electrode 142 of the transistor 200 may form an ohmic contact.

The transistor 200 according to at least one example embodiment does not require highly doped regions in the source region 121 and the drain region 122 for forming an ohmic contact of the source electrode 141 and the drain electrode 142, and thus, a smaller and/or miniature transistor having an ohmic contact may be realized.

In at least one example embodiment, the insulating layer 230 covers an entire surface of the semiconductor substrate 110, but example embodiments are not limited thereto. For example, the insulating layer 230 may be formed only between the source and drain electrodes 141 and 142 and the source and drain regions 121 and 122, and the gate insulating layer 150 may be formed in remaining regions not covered by the insulating layer 230. That is, the insulating layer 230 may have a similar shape as that of the passivation layer 130 of FIG. 1.

Figure 5:
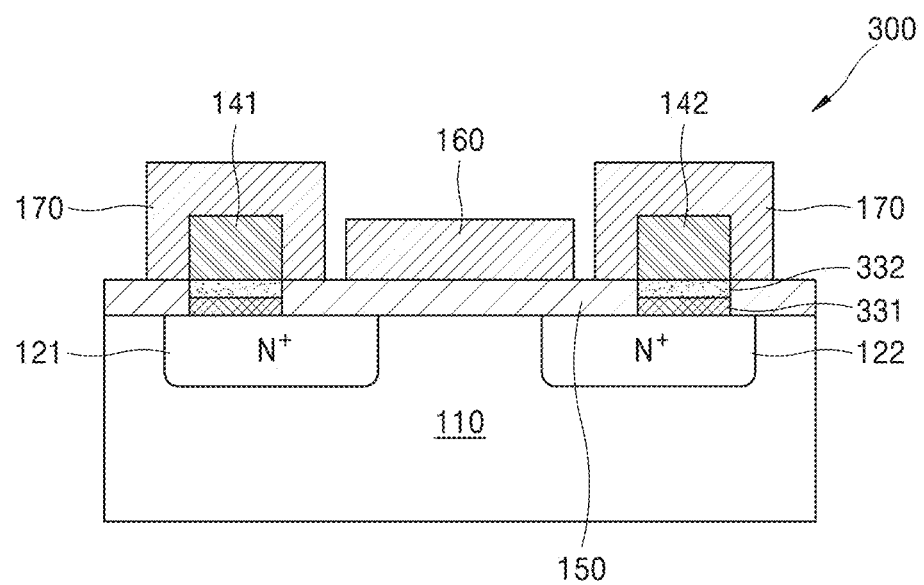
FIG. 5 is a cross-sectional view of a transistor including an electride electrode according to at least one example embodiment.

FIG. 5 is a cross-sectional view of a transistor 300 including an electride electrode according to at least one example embodiment. Like reference numerals are used to indicate elements that are substantially identical to the elements of FIG. 1, and thus the detailed description thereof will not be repeated.

Referring to FIG. 5, the transistor 300 may include two doping regions 121 and 122 that are apart from each other on a surface of a semiconductor substrate 110. The semiconductor substrate 110 may include silicon or germanium. The two doping regions 121 and 122 may be regions doped with a polarity different from that of the semiconductor substrate 110. The semiconductor substrate 110 may be a region doped with a p-type dopant, and the two doping regions 121 and 122 may be regions doped with an n-type dopant. However, example embodiments are not limited thereto. For example, the semiconductor substrate 110 may be a region doped with an n-type dopant, and the two doping regions 121 and 122 may be regions doped with a p-type dopant. The transistor 300 according to example embodiments may be a MOSFET. The doping concentration of the two doping regions 121 and 122 may be in a range of about $10^{12}$ cm$^{-3}$ to about $10^{18}$ cm$^{-3}$.

One of the two doping regions 121 and 122 may be a source region 121 and the other one may be a drain region 122. A first layer 331, a graphene layer 332, and a source electrode 141 may be stacked on the source region 121. The first layer 331, the graphene layer 332, and a drain electrode 142 may be stacked on the drain region 122.

The first layer 331 may include a passivation layer or an insulating layer. The passivation layer may combine with a dangling bond formed on a surface of the semiconductor substrate 110, and thus, the occurrence of a Fermi-level pinning phenomenon may be reduced or prevented. The passivation layer may be a Group VI material layer. The Group VI material may include Se or S. The passivation layer respectively may combine with two dangling bonds formed on the surface of the semiconductor substrate 110. The passivation layer may include one layer to about five layers thereof. The passivation layer may have a thickness in a range of about 2 Å to about 10 Å.

The insulating layer may include silicon oxide or silicon nitride. The insulating layer is formed on the surface of the semiconductor substrate 110 to reduce or prevent the formation of an interface state on the surface of the semiconductor substrate 110, and accordingly, the occurrence of a Fermi-level pinning phenomenon may be reduced or prevented. When the insulating layer has a large thickness, a resistance of the insulating layer increases, and thus, the insulating layer needs to have a small thickness. The insulating layer may include one layer to about five layers thereof. The insulating layer may have a thickness in a range of about 2 Å to about 10 Å. When the insulating layer includes more than 5 layers, the tunneling of charges may be more difficult. When the insulating layer does not cover portions of regions of the source electrode 141 and the drain electrode 142, the Fermi-level pinning phenomenon may occur, and thus, the formation of an ohmic contact may be more difficult. The graphene layer 332 formed between the first layer 331 and the source and drain electrodes 141 and 142 may include a single graphene layer. The graphene layer 332 reduces a work function of the source and drain electrodes 141 and 142 by combining with an electride material formed thereon. For example, when a two-dimensional (2D)

electride combines with the single graphene layer, a work function of the 2D electride is reduced, and accordingly, an ohmic contact of the source electrode 141 and the drain electrode 142 may be more easily formed.

Figure 6:
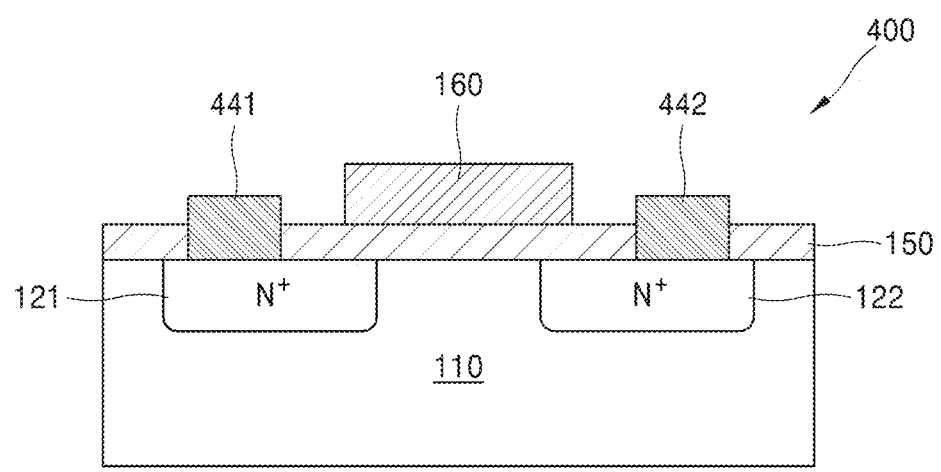
FIG. 6 is a cross-sectional view of a transistor including an electride electrode according to at least one example embodiment.

FIG. 6 is a cross-sectional view of a transistor 400 including an electride electrode according to at least one example embodiment. Like reference numerals are used to indicate elements that are substantially identical to the elements of the above example embodiments, and thus the detailed description thereof will not be repeated.

Referring to FIG. 6, the transistor 400 may include source and drain electrodes 441 and 442 including an $Y_5Si_3$ electride. The $Y_5Si_3$ electride is silicide and forms an ohmic contact on a substrate 110. Accordingly, the passivation layer 130 (refer to FIG. 1) or the insulating layer 230 (refer to FIG. 4) between the source and drain regions 121 and 122 and the source and drain electrodes 441 and 442 may not be needed to form an ohmic contact. The source and drain electrodes 441 and 442 do not require a conductive layer (for example, the metal layer 170 (refer to FIG. 1)) covering thereon.

Also, the $Y_5Si_3$ electride is a stable material with respect to moisture and air at room temperature. Accordingly, the metal layer 170 for reducing or preventing an oxidation of electrodes is not needed.

The transistor 400 that uses the $Y_5Si_3$ electride as electrode materials does not require highly doped regions in the source region 121 and the drain region 122 for forming an ohmic contact of the source electrode 441 and the drain electrode 442, and thus, a smaller and/or miniature transistor having an ohmic contact may be realized.

A transistor including an electride electrode according to at least one example embodiment includes source and drain electrodes including a material having a low work function, and thus, the transistor does not require highly doped well regions in a source region and a drain region for forming an ohmic contact, and thus, a smaller and/or miniature transistor having an ohmic contact may be realized.

The passivation layer according to at least one example embodiment combines with a dangling bond formed on a surface of a substrate to reduce or prevent the occurrence of a Fermi-level pinning phenomenon, and thus, enables the source and drain electrodes to have an ohmic contact.

While one or more example embodiments have been described with reference to the figures, it will be understood by those of ordinary skill in the art that various changes in form and details may be made therein without departing from the spirit and scope as defined by the following claims.

What is claimed is:

1. A transistor comprising:
   a doped substrate;
   a source region and a drain region doped with ions of a polarity different from that of the doped substrate in a surface of the doped substrate;
   a source electrode and a drain electrode comprising an electride material on the source region and drain region, respectively;
   a gate insulating layer on the doped substrate to surround the source electrode and the drain electrode; and
   a gate electrode on the doped substrate between the source electrode and the drain electrode,
   wherein each of the source electrode and the drain electrode is a single layer.

2. The transistor of claim 1, further comprising a metal layer on the gate insulating layer to cover the source electrode and the drain electrode.

3. The transistor of claim 1, wherein the source electrode and the drain electrode contact the source region and the drain region, respectively, and the source electrode and the drain electrode comprise an $YsSi_3$ electride.

4. The transistor of claim 1, further comprising a passivation layer on lower sides of the source electrode and the drain electrode to contact the substrate.

5. The transistor of claim 4, wherein the source electrode and the drain electrode comprise a $C_{12}A_7$ electride or a $YsSi_3$ electride.

6. The transistor of claim 4, wherein the source electrode and the drain electrode comprise a two-dimensional (2D) electride and the 2D electride is $Ca_2N$, $Y_2C$, and $Gd_2C$ or a combination or subcombination thereof.

7. The transistor of claim 6, wherein the 2D electride is a single crystal including an interlayer electron layer, and the interlayer electron layer of the 2D electride is vertically arranged with respect to the surface of the doped substrate.

8. The transistor of claim 4, wherein the passivation layer comprises a Group VI material layer configured to combine with a dangling bond on a surface of the doped substrate.

9. The transistor of claim 8, wherein the Group VI material layer comprises Se or S.

10. The transistor of claim 8, wherein the passivation layer has a thickness that is less than that of the gate insulating layer.

11. The transistor of claim 8, wherein the Group VI material layer has a thickness of one layer to about five layers thereof.

12. The transistor of claim 4, wherein the passivation layer is an insulating layer.

13. The transistor of claim 1, further comprising an insulating layer on the doped substrate to cover the source region and the drain region, wherein the source electrode and the drain electrode and the gate insulating layer are on the insulating layer.

14. The transistor of claim 13, wherein the insulating layer has a thickness less than that of the gate insulating layer.

15. The transistor of claim 14, wherein the insulating layer comprises silicon oxide or silicon nitride.

16. The transistor of claim 15, wherein the insulating layer comprises one layer to about five layers thereof.

17. A transistor comprising:
   a doped substrate;
   a source region and a drain region doped with ions of a polarity different from that of the doped substrate in a surface of the doped substrate;
   a source electrode and a drain electrode comprising an electride material on the source region and drain region, respectively;
   a gate insulating layer on the doped substrate to surround the source electrode and the drain electrode;
   a gate electrode on the doped substrate between the source electrode and the drain electrode;
   a passivation layer on lower sides of the source electrode and the drain electrode to contact the substrate, the passivation layer comprising a Group VI material layer configured to combine with a dangling bond on a surface of the doped substrate; and
   a single graphene layer between the Group VI material layer and the source electrode and the drain electrode.

18. A transistor comprising:
   a doped substrate;
   a source region and a drain region doped with ions of a polarity different from that of the doped substrate in a surface of the doped substrate;

a source electrode and a drain electrode comprising an electride material on the source region and drain region, respectively;
a gate insulating layer on the doped substrate to surround the source electrode and the drain electrode;
a gate electrode on the doped substrate between the source electrode and the drain electrode;
a passivation layer on lower sides of the source electrode and the drain electrode to contact the substrate; and
a single graphene layer between the insulating layer and the source electrode and the drain electrode,
wherein the passivation layer is an insulating layer.

* * * * *